(12) United States Patent
Yachareni et al.

(10) Patent No.: US 8,295,099 B1
(45) Date of Patent: Oct. 23, 2012

(54) DUAL PORT MEMORY WITH WRITE ASSIST

(75) Inventors: Santosh Yachareni, San Jose, CA (US);
Subodh Kumar, San Jose, CA (US);
Hsiao Chen, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 223 days.

(21) Appl. No.: 12/790,632

(22) Filed: May 28, 2010

(51) Int. Cl.
*G11C 7/10* (2006.01)
*G11C 8/00* (2006.01)

(52) U.S. Cl. .............................. 365/189.04; 365/230.05
(58) Field of Classification Search .............. 365/189.04
See application file for complete search history.

(56) References Cited

U.S. PATENT DOCUMENTS

| | | | |
|---|---|---|---|
| 4,791,613 A * | 12/1988 | Hardee | 365/189.09 |
| 6,285,604 B1 * | 9/2001 | Chang | 365/200 |
| 6,671,201 B2 * | 12/2003 | Masuda | 365/154 |
| 7,379,354 B2 * | 5/2008 | Heinrich-Barna et al. | 365/189.16 |
| 7,411,813 B2 * | 8/2008 | Maki | 365/154 |
| 7,701,783 B2 * | 4/2010 | Yamagami | 365/189.06 |
| 7,746,717 B1 * | 6/2010 | Peng et al. | 365/210.1 |
| 7,894,296 B2 * | 2/2011 | Lee et al. | 365/230.05 |
| 8,045,402 B2 * | 10/2011 | Yeung | 365/189.16 |
| 2007/0279966 A1 * | 12/2007 | Houston | 365/154 |
| 2011/0305072 A1 * | 12/2011 | Ishii et al. | 365/154 |

OTHER PUBLICATIONS

Pilo et al., An SRAM Design in 65-nm Technology Node Featuring Read and Write-Assist Circuits to Expand Operating Voltage, IEEE Journal of Solid-State Circuits, vol. 42, No. 4, Apr. 2007, pp. 813-819.

* cited by examiner

*Primary Examiner* — Son Mai
(74) *Attorney, Agent, or Firm* — Scott Hewett; Gerald Chan (57) ABSTRACT

A data value is read from one port of a dual-port memory cell during a clock cycle. A WRITE assist pulse having a delay from an end-of-read signal is generated. The delay and duration of the WRITE assist pulse are optionally user-selectable. A high voltage (e.g., Vdd) is coupled to the bitlines (e.g., BL-A, BLc-A) of the first port during the WRITE assist pulse, and a low voltage value (e.g., zero) is written to the memory cell through the second port (e.g., BL-B, BLc-B) during the clock cycle.

20 Claims, 5 Drawing Sheets

DUAL PORT MEMORY WITH WRITE ASSIST

FIELD OF THE INVENTION

An embodiment of the invention relates to integrated circuits (ICs) and more particularly to ICs having dual port memory such as static random access memory (SRAM) cells.

BACKGROUND OF THE INVENTION

SRAM is a type of electronic memory used in ICs to store data. An SRAM cell can be written to or read from. Generally, an SRAM cell provides a voltage at an output port that is sensed by a sense amplifier that senses whether the voltage held in the SRAM represents a digital value of 1 or a digital value of 0. Some SRAMs have a single port used to both write data in and read data out. Other SRAMs have dual ports which can be used in a variety of ways and for various purposes. In some ICs, dual port SRAM cells may be operated in single-port or in dual-port mode.

One mode of operating a dual port SRAM allows a READ operation to occur at one or both ports while a READ/WRITE operation occurs at one port during the same clock cycle. Such operation is commonly called a READ-first operation or READ-first mode. As IC geometries and operating voltage levels have been reduced, the voltage margins for READ and WRITE operations have also become smaller. Similarly, as operating speeds have increased, timing margins have also become smaller.

In dual port SRAM with sufficient timing and voltage margins, READ-first operation has operated reliably. However, as timing and voltage margins have been reduced, operational errors have occurred. One type of error is that the WRITE operation does not achieve a sufficiently high voltage level in the SRAM cell by the end of the clock cycle to accurately represent the intended data state.

One approach that has been used to address WRITE margin errors has been to increase the current available to the bitlines, basically, to drive the SRAM cell harder. This approach is not feasible in a single power supply architecture where no latency is allowed during read/write operations. Techniques for improving WRITE margins in READ-first operation of dual port SRAM that avoid the disadvantages of the prior art are desirable.

SUMMARY OF THE INVENTION

In one embodiment, a data value is read from a dual-port memory cell in an IC during a clock cycle. The dual port memory cell has a first state having a high voltage value (e.g., a value of one) at a first internal node (e.g., the true node) of an dual port memory cell and a low voltage value at a second internal node (e.g., the complementary node) of the dual port memory cell. A first bitline and a second bitline are selectively coupled to the first internal node and a first complementary bitline and a second complementary bitline are selectively coupled to the second internal node thorough access transistors. An end-of-read signal is generated by the IC, and a WRITE assist pulse having a delay from the end-of-read signal and a duration is generated by the IC. A high voltage value is coupled to each of the first bitline and the first complementary bitline of the dual port memory cell during the WRITE assist pulse. A low voltage value is written to the first internal node and a high voltage value to the second internal node during the clock cycle.

In another embodiment, an IC has a first wordline, a second wordline, a first port bitline, a first port complementary bitline, a second port bitline, a second port complementary bitline, a memory cell having a first internal node connectable to the first port bitline through a first access transistor controlled by the first wordline and to the second port bitline through a second access transistor controlled by the second wordline, and a second internal node connectable to the first port complementary bitline through a third access transistor controlled by the first wordline and to the second port complementary bitline through a fourth access transistor controlled by the second wordline, and a pull-up voltage supply. The IC also has a WRITE-assist pulse generator circuit producing a WRITE assist signal having a selected period; and a switch selectively coupling the pull-up voltage supply to the first port bitline and to the first port complementary bitline according to the WRITE assist signal for the selected period while the first port bitline is connected to the first internal node through the first access transistor and the first port complementary bitline is connected to the second internal node through the third access transistor.

In another embodiment, an integrated circuit (IC) includes a pull-up voltage supply, a memory cell having a first port and a second port, a first wordline coupled to the first port of the memory cell, a second wordline coupled to the second port of the memory cell, a first port bitline, a first port complementary bitline, a second port bitline, a second port complementary bitline, and a bitline pre-charge circuit. A WRITE-assist pulse generator produces a WRITE assist signal having a period and a duration. A WRITE-assist circuit selectively connects the pull-up voltage supply to the first port bitline and to the first port complementary bitline through the bitline pre-charge circuit according to the WRITE assist signal or a bitline pre-charge signal.

DETAILED DESCRIPTION OF THE DRAWINGS

Figure 1:
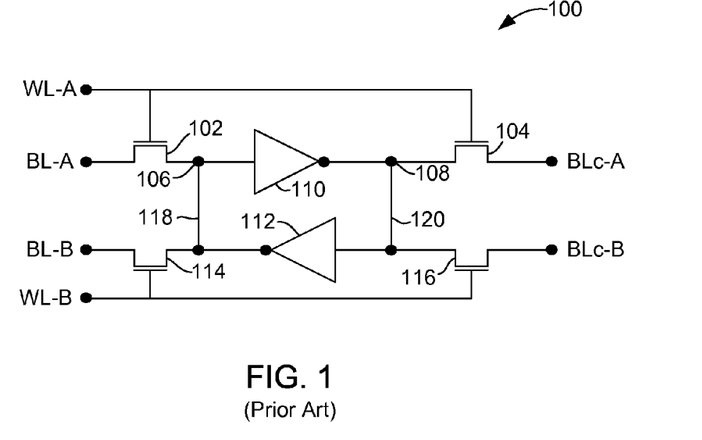
FIG. 1 is a circuit diagram of a conventional dual port SRAM cell.

FIG. 1 is a circuit diagram of a conventional dual port SRAM cell 100. The SRAM cell has two ports, port A and port B. Port A is selected by providing a control signal on word line A (WL-A), which switches access transistors 102, 104 from a non-conducting state to a conducting state, connecting the bit line for port A (BL-A) and the complementary bit line for port A (BLc-A) to the internal nodes 106, 108 of the memory cell. For purposes of convenient discussion, internal node 106 will be referred to as the "true" (i.e., true data value) node, and internal node 108 will be referred to as the "complementary" node. As is well known in the art of SRAM design and use, the inverters 110, 112 hold the complementary node 108 at the opposite binary data state of the data state held at the true node 106. In other words, if node 106 stores a voltage representing a digital value of 1, the complementary node 108 will store a voltage representing a digital value of 0, and vice versa.

During a synchronous READ operation, before the WL-A is active, the bitlines BL-A, BLc-A are precharged to Vdd. The wordline WL-A is then activated, connecting the bitlines BL-A, BLc-A are connected to the internal nodes 106, 108 and the true and complementary data values are provided to a sensing amplifier (commonly called a sense amp, not shown), which detects the data state of the memory cell (e.g., the data stated represented by the voltage at node 106). Providing both the true data value and complementary data value is desirable when using differential sensing techniques. The operation of memory cells and sensing techniques are well known in the art of memory array design and operation, and a detailed description of such procedures is omitted. Similarly, a control signal on word line B (WL-B) switches access transistors 114, 116 ON and connects bitline B (BL-B) and complementary bitline B (BLc-B) to the memory cell nodes 106, 108.

In an exemplary READ-first operation, the bitlines BL-A, BLc-A, BL-B, BLc-B are pre-charged to a voltage, such as Vdd. When the wordlines WL-A, WL-B are turned on, either the bitlines BL-A, BL-B or complementary bitlines BLc-A, BLc-B are discharged through the memory cell because either the true 106 or complementary 108 node will be at or near the high voltage value. For example, if a data value of 1 is represented by a high voltage at node 106 that is at or near Vdd, then the voltage at node 108 will be essentially ground. When the word line connects BLc-A to node 108 through access transistor 104, BLc-A is discharged from the pre-charge Vdd level to essentially ground. The sense amp (not shown) detects the voltage on the BL-A (essentially Vdd) and on BLc-A (essentially ground potential) and produces a data value for the memory cell. (i.e., reads a data value of 1).

In a typical READ-first (READ+WRITE) operation from any single port, e.g, port B, BL-B, BLc-B are precharged to Vdd, and the word line WL-B is turned on, which initiates the READ, switching from READ to WRITE happens and while writing a 0 value to the memory cell, the bitline BL-B is pulled to essentially ground potential through a pull-down transistor (not shown), the complementary bitline BLc-B is pulled up to essentially Vdd through transistor 116.

In a READ-first operation, which reads the data value of the memory cell and then writes a new data value to the memory cell on the same clock cycle, the READ operation occurs generally as described above, reading data from port A, for example. During a READ-first operation, a READ occurs from port B, and then the WRITE occurs from port B (i.e., the voltages on BL-B and BLc-B will be switched to the internal nodes 106, 108). Both ports (port A and port B) on each side of the inverters 110, 112 (i.e, the true side 106 and the complementary side 108) are tied together through shorts 118, 120. During a WRITE 0 on port B, BLc-B is at Vdd to write a 1 value at node 108. However, BLc-A, which is still connected to ground through access transistor 104 while the WL-A signal is high, presents a large discharged capacitance load that interferes with the WRITE operation. This can cause a write margin error while writing a 0 from port B because charge flows from BLc-B onto BLc-A rather than lifting the voltage at the complementary node 108 to a logical 1.

Figure 2:
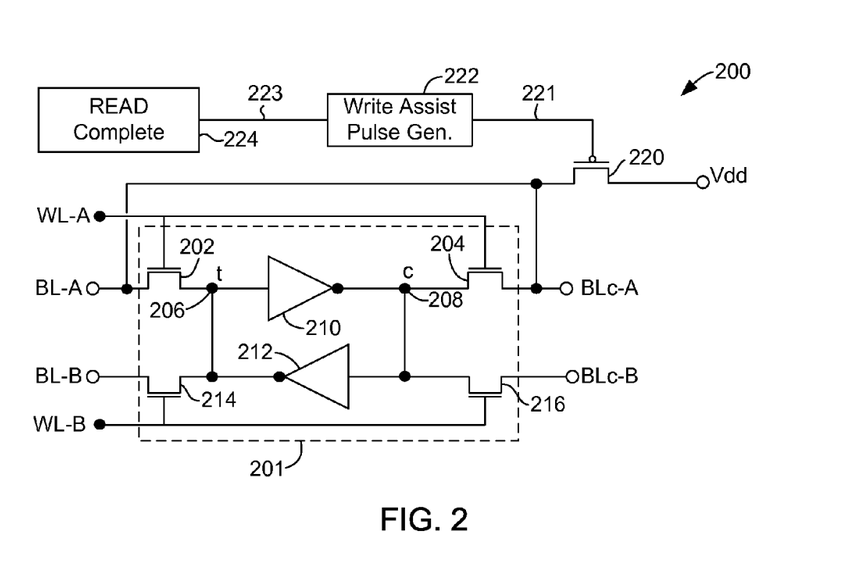
FIG. 2 is an SRAM cell with a write assist circuit according to an embodiment.

FIG. 2 is an SRAM cell with a write assist circuit 200 according to an embodiment. The SRAM cell 201 operates substantially as described above in reference to FIG. 1. The SRAM cell has access transistors 202, 204, 214, 216 connecting internal nodes 206, 208 to bitlines according to control signals on the wordlines. The inverters 210, 212 establish opposite data states on the internal nodes 206, 208. Internal node 208 is selectively coupled to a pull-up supply (Vdd) through a switch 220 which pulls the first port bitlines BL-A and BLc-A back to Vdd at the end of the READ operation from the first port (port A) and before a one value is written at the second port (port B). The switch 220 is operated according to a control signal 221 from a WRITE assist pulse generator circuit 222.

The WRITE assist pulse generator circuit 222 generates a WRITE assist signal 221 that briefly closes the switch 220 after the READ operation on port A is complete while port A is still active during the clock cycle on the wordline WL-A to provide a WRITE assist pulse to BL-A and BLc-A. The WRITE assist pulse replenishes the charge on node Blc-A, through device 220, to improve the WRITE 0 operation on port B in a READ first mode. The WRITE assist pulse generator circuit 222 closes the switch 220 after receiving a READ complete signal 223 from a READ complete circuit 224. Many SRAM ICs generate a sense amp output signal when the sense amplifier has successfully read the state of a memory cell. Timing budgets typically allow the sense amp to read the cell well before the end of the clock cycle (see, FIG. 5, wordline waveform 503, bitline waveform 504 (BLc-B), 506 (BL-B), 510 (BLc-A)). After the sense out signal is generated, a few picoseconds of delay is desirable in some embodiments to insure the data value read by the sense amp is latched. Some ICs according to some embodiments include the latch delay in the READ complete signal 223, while ICs according to alternative embodiments do not. Thus, in some embodiments the WRITE assist pulse generator 222 includes a delay circuit for adding sense amp latching delay, as well as for placing the edge of the WRITE assist pulse (see, FIG. 5, WRITE assist pulse 508).

Figure 5:
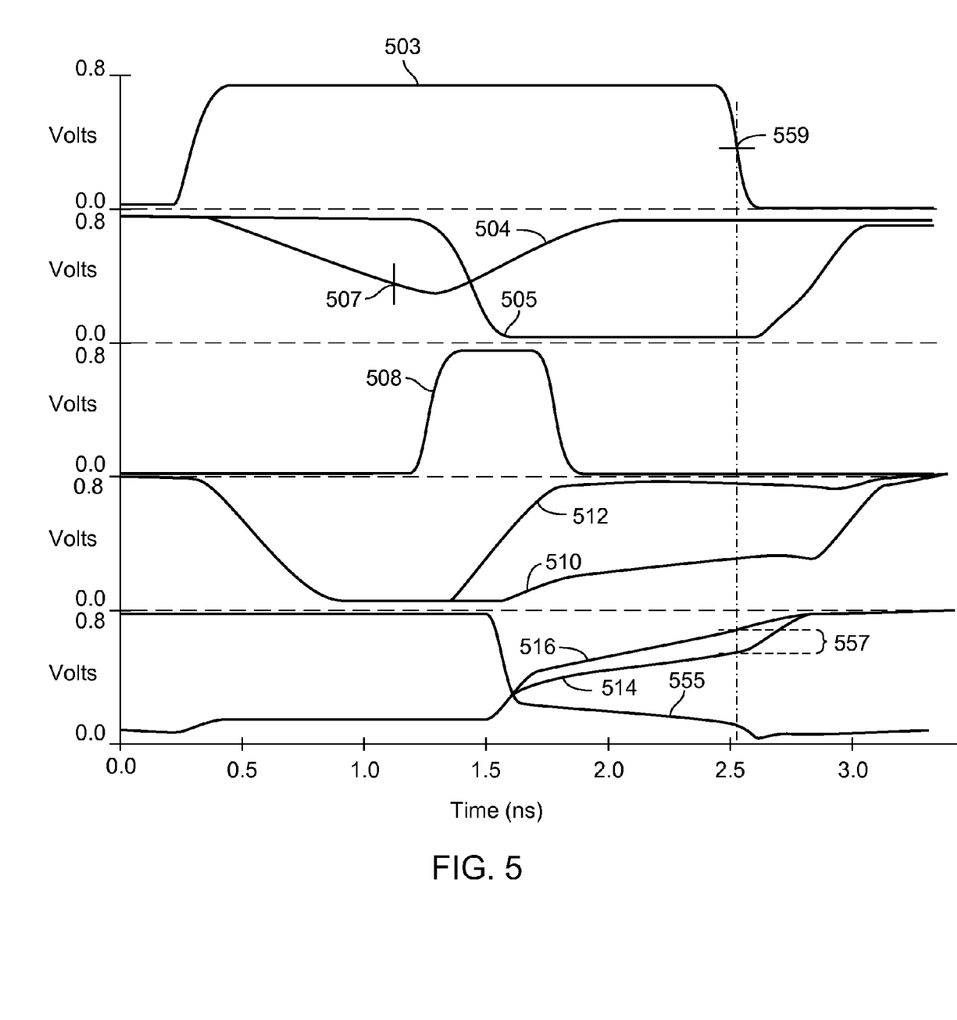
FIG. 5 shows plots of waveforms generated using a circuit simulation of an IC operated according to an embodiment.

In a particular embodiment, the WRITE assist pulse generator 222 includes a trimmable (i.e., user selectable or manufacturer selectable) delay circuit for placing the edge of the WRITE assist pulse at a selected point in the clock cycle (FIG. 5, wordline waveform 503). The WRITE assist pulse generator 222 also includes a trimmable pulse width generator circuit for setting the duration of the WRITE assist pulse.

The WRITE assist pulse (FIG. 5, plot 508), is desirably of sufficient duration to improve the WRITE margin in a dual port READ-first operation of a dual-port SRAM. It is generally desirable that the WRITE assist pulse end sufficiently before the end of the clock cycle (see, e.g., FIG. 5, ref. nums. 503, 509, 508) so as to not interfere with the inverters 210, 212 establishing the proper logic states on the internal nodes, and to have a successful write operation through port B. For example, if a WRITE assist pulse was too long (e.g., persisted too long after end-of-read), an imbalance of current through the inverters 210, 212 might occur because the current supplied through the switch 220 adds to the bitlines BL-A and BLc-A or current from the pull-up supply will be dumped to ground, which can affect the voltage the pull-up supply provides to other circuit components, if any.

In a particular embodiment, the pull-up supply is Vdd, and in a more particular embodiment, the bitline pre-charge circuit, which is commonly used in SRAM to charge bitlines prior to connecting the bitlines to the internal nodes through the access transistors, is used to provide the power for the WRITE assist pulse. In an exemplary embodiment, the bitline pre-charging circuit (see, e.g., FIG. 4, ref. nums. 408, 410, 414, and BL pre-charge signal 426) of an IC is used to pull-back the READ port of an SRAM cell during the READ-first operation while the word line is still high.

A trimmable WRITE assist pulse generator circuit allows optimization of the WRITE assist pulse for different operating conditions or for different physical devices. For example, a programmable logic device, such as a field-programmable gate array (FPGA) may include SRAM operable at different clock rates. The optimal placement and duration of a WRITE assist pulse for one clock rate may be different than for another clock rate, or no WRITE assist pulse may be necessary for one clock rate, yet desirable for another. Similarly, fabricated ICs show process variation arising from cumulative factors associated with process controls. An IC meeting its published specifications may exhibit operational characteristics that are relatively faster or slower, for example, than another IC manufactured to the same specifications. This type of variation can occur between wafer lots, between wafers within a wafer lot, and even between ICs fabricated from the same wafer. The differences in performance arising from such process variations are generally referred to as process corners.

An IC from one process corner may have a different optimal WRITE assist pulse than for an IC from the opposite process corner. Thus, it is desirable in some embodiments to provide a trimmable WRITE assist pulse generator circuit to adjust the WRITE assist pulse for a particular IC chip. Alternatively, a fixed WRITE assist pulse generator circuit provides essentially the same WRITE assist pulse (i.e., the same delay from sense out and same duration) for all ICs. In other embodiments, the delay from sense out is trimmable, while the duration is fixed, and in yet other embodiments, the delay from sense out is fixed, and the duration of the WRITE assist pulse is trimmable. In some embodiments, ICs are fabricated with trimmable WRITE assist pulse generator circuits, and the pulse timing is fixed by the manufacturer before the IC chips are shipped to users.

Figure 3:
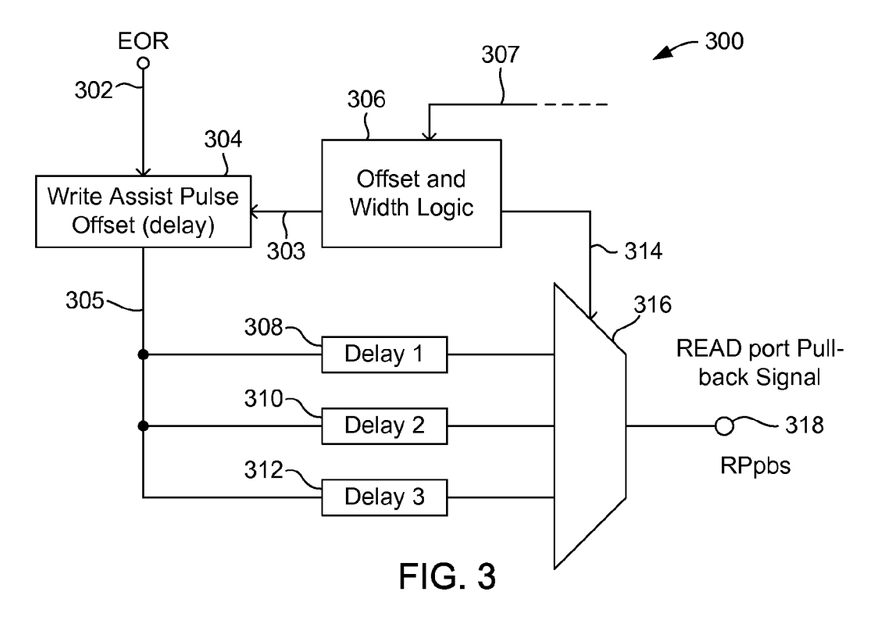
FIG. 3 is a portion of a circuit diagram of a WRITE assist pulse generator circuit according to an embodiment.

FIG. 3 is a portion of a circuit diagram of a WRITE assist pulse generator circuit 300 according to an embodiment. An end of READ (EOR) signal 302 is coupled to a write assist pulse offset circuit 304 and a selected amount of delay is added to adjust the leading edge placement of the desired WRITE assist pulse. The EOR signal may occur concurrently with the sense out signal toggling, or may include a fixed amount of delay to insure data latching from the sense amp (not shown). In a particular example, SRAM built according to a 40 nm node technology adds about 60 pico-seconds to the sense out signal to produce the EOR signal. The offset delay is added by multiplexing taps of a delay line and selecting the tap according to control circuit such as offset and width logic 306, for example. The offset and width logic 306 controls the pulse offset portion (e.g., the write assist pulse offset circuit 304) and controls the multiplexer 316 to select the desired delay (e.g., delay line 308, 310, 312) according to a digital control trimmable signal 307, which sets the width of the WRITE assist pulse. The multiplexer and delay lines operate as a pulse width portion of the pulse generator circuit. The write assist pulse offset circuit 304 generates a pulse start signal 305 that initiates the WRITE assist pulse at the selected delay following the EOR signal 302 or alternatively a sense out signal. The pulse start signal 305 is combined with the selected delay (e.g., 308, 310, or 312) to produce the READ port pull-back signal (pulse control signal) 318. Several suitable techniques for producing delays on the order of about 10 pico-seconds (ps) to about 100 ps are known in the art of digital IC timing, such as serial inverters or logic gates. In some embodiments, a series of inverters or other logic gates includes a number of taps, and the multiplexer selects the tap that provides the desired delay (pulse width).

WRITE assist pulse width is trimmed by selecting one of several delay lines 308, 310, 312. While only three delays are shown, alternative WRITE assist pulse generator circuits may have other numbers of selectable delays. The offset and width logic 306 generates a multiplexer select signal 314 that operates the multiplexer 316 to add the desired delay to the pulse start signal 305 and produce a READ port pull-back signal 318. A typical pulse duration is about 150 pico-seconds; however, that duration is merely exemplary in a particular SRAM fabricated according to a 32 nm node design technology. The pulse control is generated for each EOR cycle, independent of READ 1 or a READ 0 through port A, if port A is not doing any write operation.

Figure 4:
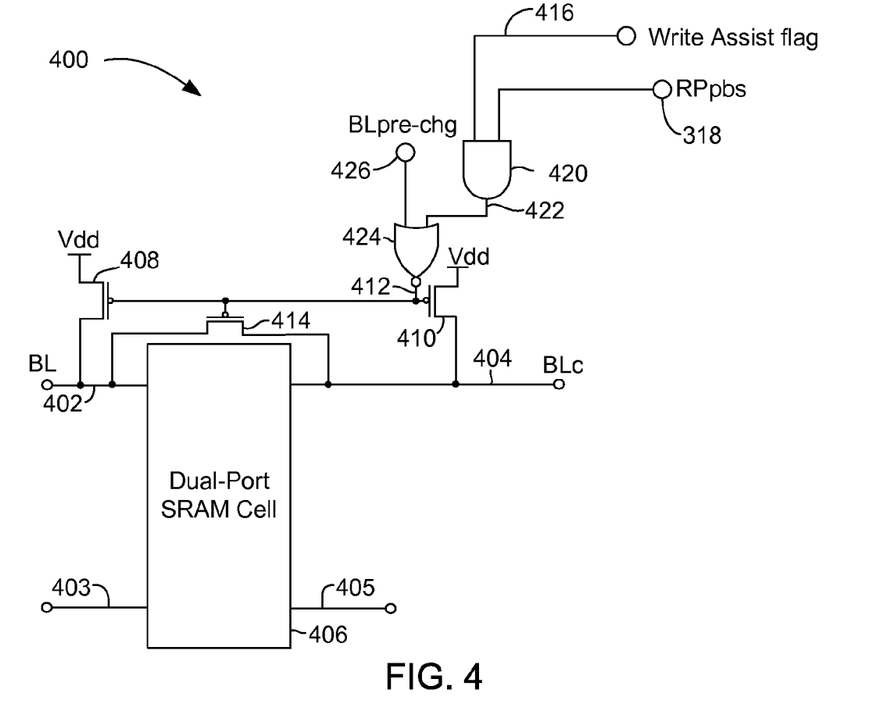
FIG. 4 is a circuit diagram of a portion of a WRITE assist circuit according to an embodiment.

FIG. 4 is a circuit diagram of a portion of a WRITE assist circuit 400 according to an embodiment. The bitlines 402, 404 are connected to one port of a dual port SRAM memory cell 406. Pull-up switches 408, 410 are operated according to a WRITE assist control signal 412, as is the bitline balancing transistor 414. In a particular embodiment, the pull-up switches 408, 410 and the bitline balancing transistor 414 are also used in conventional bitline pre-charging operations that are controlled by bitline pre-charge signal 426. A WRITE assist pulse is generated when a WRITE assist flag 416 is present, indicating a READ (either a Read 0 or a Read 1) has occurred at one port of the dual port SRAM cell 406. The NOR gate 424 activates PMOS pull-up transistors 408, 410 when either the bitline pre-charge signal 426 or the WRITE assist signal 422 is valid. Thus, embodiment may use existing bitline pre-charge circuitry (e.g., PMOS transistors 408, 410, 414) of an IC in a WRITE assist operation.

The AND gate 420 produces a WRITE assist signal 422 when both the WRITE assist flag 416 and READ port pull-back signal 318 are present. The READ port pull-back signal 318 is present after the end of read (see FIG. 3, ref. num. 302) according to the WRITE assist pulse offset and width. NOR gate 424 produces a WRITE assist control signal 412, pulsing the node BL-A, and BLc-A back to Vdd. Pulsing BLC-A back to Vdd is shown in FIG. 5, plot 512. Plot 510 shows BL-A without the pulse bitline design. The bitline pre-charge signal 426 is used during the end of any operation to hold the nodes BL-A, BLc-A, BL-B, BLc-B to Vdd, at the end of any READ/WRITE operation.

FIG. 5 shows plots of waveforms generated using a circuit simulation of an IC operated according to an embodiment. Each waveform is shown on the same time base (x-axis) and on a voltage scale between zero and 0.8 volts, which are the high and low voltages associated with digital values in the modeled system. Basically, a waveform transitions between one voltage (e.g., zero volts) and the other voltage (e.g., 0.8 volts) when changing state. The simulation was run on a dual port SRAM cell fabricated according to a 32 nm node design technology with Vdd=0.8 V.

A wordline waveform during a synchronous dual port READ-first operation 503 (WL-A, WL-B) goes high during a READ-first operation of the dual port SRAM cell during a READ 1 on port A, and a parallel READ 1 followed by WRITE 0 on port B. Plot 504 shows the voltage on the port B complementary bitline (BLc-B), which is pre-charged to Vdd before the wordline goes high, and, since the memory cell is storing a value of 1 (which in this example is a high voltage value, e.g., Vdd, on node "C"), starts discharging to zero through the READ portion of the READ-WRITE operation, and then is pulled high during the WRITE zero portion. Plot 505 shows the voltage on the port B bitline BL-B, which is also pre-charged to Vdd and remains at Vdd through the inverters of the memory cell during the READ operation. An end of read (EOR) timing point 507 is shown for reference. The sense amp reads the data value of the memory cell well before the end 559 of the word line activation signal 503. After the EOR 507, the timing pulse 508 boosts the voltage on BL-A and BLc-A for the enhanced WRITE 0 port B operation, which occurs on the port B bitline at approximately point

508. The WRITE 0 to the port B bitline writes a 1 to the node connected to BLc-B, and a 0 to BL-B. The WRITE operation completes during the wordline cycle 503. After writing to the SRAM cell, the cell establishes the correct static voltage levels at the true and complementary nodes.

Plot 508 shows the WRITE assist pulse, which occurs after the EOR signal 507, and ends before the end 559 of the word line activation signal 503. In this example, the WRITE assist pulse rises about 60 ps after the EOR signal and lasts for about 500 ps. The WRITE assist pulse ends about 700 ps before the wordline goes low.

Plot 516 shows the voltage at one node (e.g., complementary node 208 in FIG. 2) with a WRITE assist pulse according to an embodiment of the invention. Plot 514 shows the voltage at the node without a WRITE assist pulse. Plot 555 is the voltage at the other node (e.g., true node 206 in FIG. 2) with and without the WRITE assist pulse. The WRITE margin is described and the difference in voltages between the true and complementary nodes (e.g., between plot 516 and plot 555, and between plot 514 and plot 555) node 108 minus plot 106) when the clock signal 503 goes low (which in this example is defined at the voltage 559 half-way between the high and low values). The figure shows that the write margin has improved by about 50%. (indicated by bracket 557), showing that the pulse bitline improves the write margin significantly. Plot 510 shows the voltage on BLc-B (see, FIG. 2) without a WRITE assist pulse and plot 512 shows the voltage on BLc-B with the WRITE assist pulse 508. Comparing these two plots shows that providing the WRITE assist pulse increases the voltage on BLc-A. Plot 514 shows the cell margin for the dual port SRAM cell without a WRITE assist pulse, and plot 516 shows the cell margin for the dual port SRAM cell with the WRITE assist pulse 508. A 50% improvement in cell margin 557 is expected when providing a WRITE assist pulse 508 for the above example.

Figure 6:
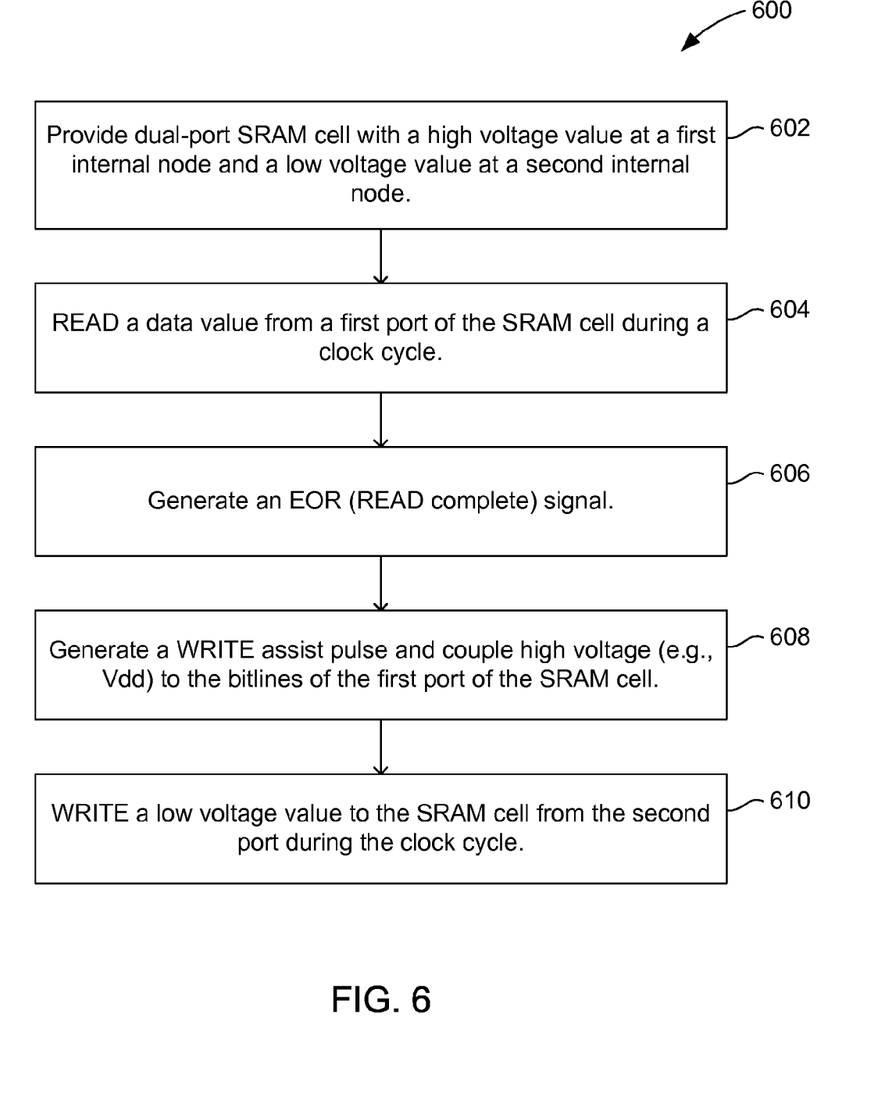
FIG. 6 is a flow chart of a process of operating an IC according to an embodiment.

FIG. 6 is a flow chart of a process of operating an IC 600 according to an embodiment. The IC has a dual-port SRAM cell, a sense amplifier, logic for determining an end-of-read and generating an EOR signal, and logic for generating a WRITE assist pulse. In a particular embodiment, the IC also has bitline pre-charge circuitry, and in a further embodiment, the IC has logic for selectively controlling the offset and duration of the WRITE assist pulse.

The IC is provided with the dual-port SRAM cell in a first logic state (e.g., having a high voltage value at a first (true) internal node of the SRAM cell and a low voltage value at a second (complementary) internal node of the SRAM cell) (step 602). During a synchronous memory access operation, a data value is read from a first port of the SRAM cell (step 604) by sensing a differential voltage between a first port bitline coupled to the first internal node and a first port complementary bitline coupled to the second internal node. When the value has been read, an EOR (also known as a READ complete) signal is generated (step 606). A WRITE assist pulse having a selected offset from the EOR signal and a selected duration is generated, which couples a high voltage supply (e.g., Vdd) to the bitlines of the first port (e.g., bitlines BL-A and BLc-A) to increase the voltage of the second internal node (step 608) (which is still coupled to the bitlines through the access transistors during the clock cycle). A low voltage value is written from the second port of the SRAM cell (e.g., a low value to the true node from BL-B and a high value to the complementary node from BLc-B) (step 610) through the access transistors during the clock cycle.

In a particular embodiment, the WRITE assist pulse is offset from the EOR signal at least 10 pico-seconds to allow for data latching from the sense amplifier. In a particular embodiment, the duration of the WRITE assist pulse is about 10 ns to about 15 ns. In a particular embodiment, the WRITE assist pulse ends at least 500 ps before the end of the clock cycle. In a particular embodiment, the WRITE assist pulse couples the bitline precharge circuit to the second internal node for the selected duration.

Figure 7:
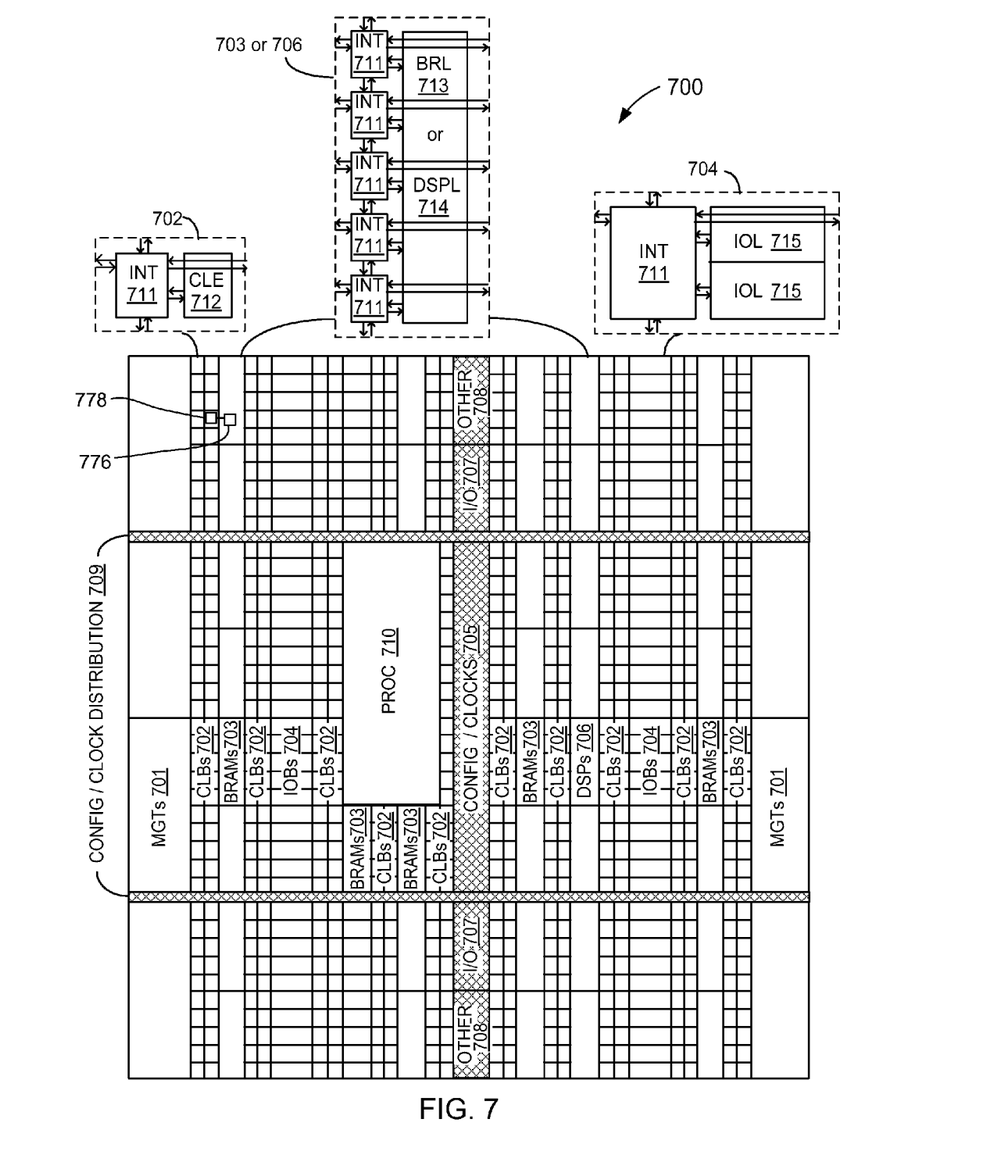
FIG. 7 is a floorplan of a programmable logic device configured to operate according to an embodiment.

FIG. 7 is a plan view of an IC 700 including one or more SRAM cells with WRITE assist according to one or more embodiments. The IC 700 is an FPGA, but is alternatively a different type of IC, such as graphics processor, microprocessor, logic device or other IC incorporating SRAM. The FPGA is fabricated using a CMOS fabrication process or mixed CMOS/NMOS process and incorporates one or more memory cells according to one or more embodiments of the invention. For example, a memory cell 776 according to an embodiment is incorporated into a block of RAM 703. A single IC may have many SRAM memory cells according to an embodiment or different memory cells according to different embodiments. For example, a first memory array or portion of a memory array may have SRAM memory cells with a first WRITE assist pulse of a first offset and duration, and a second SRAM memory cells with a second WRITE assist pulse of a second offset or duration.

The FPGA architecture includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710). In a particular embodiment, a portion of a configurable logic block 778 is configured into a WRITE assist pulse timing logic (see, e.g., FIG. 3, ref. num. 306).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). A differential I/O buffer 718 is also part of IOB 704. As will be clear to those of skill in the art, the actual I/O pads connected, for example, to the differential I/O buffer 718 are manufactured using metal layers above the various illustrated logic blocks, and typically are not confined to the area of the input/output differential I/O buffer 718. In the pictured embodiment, a columnar area 709 near the center of the die is used for configuration, clock, and other control logic.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of memory cells or memory arrays, alternative WRITE assist techniques, and various pulse generating techniques or power supplies could be alternatively used. Therefore, the spirit and scope of the appended claims should not be limited to the foregoing description.

The invention claimed is:

1. A method of operating an integrated circuit (IC) comprising:
    providing the IC with a dual-port memory cell in a first state having a high voltage value at a first internal node of the dual port memory cell and a low voltage value at a second internal node of the dual port memory cell, a first bitline and a second bitline being selectively coupled to the first internal node and a first complementary bitline and a second complementary bitline being selectively coupled to the second internal node;
    reading a data value from the dual port memory cell during a clock cycle;
    generating an end-of-read signal;
    generating a WRITE assist pulse having a delay from the end-of-read signal and a duration;
    coupling a high voltage to each of the first bitline and the first complementary bitline of the dual port memory cell during the WRITE assist pulse; and
    writing a low voltage value to the first internal node and a high voltage value to the second internal node during the clock cycle.

2. The method of claim 1 wherein coupling the high voltage comprises coupling Vdd to each of the first bitline and the first complementary bitline of the dual port memory cell during the WRITE assist pulse during the clock cycle.

3. The method of claim 1 wherein the WRITE assist pulse ends during the clock cycle.

4. The method of claim 1 wherein the delay is sufficient to allow data latching of the data value read from the dual port memory cell.

5. The method of claim 1 therein the duration is sufficient to end the WRITE assist pulse at least 500 ps before an end of the clock cycle.

6. The method of claim 1 wherein the IC has a bitline pre-charge circuit and the WRITE assist pulse activates the bitline pre-charge circuit to couple the high voltage to each of the first bitline and the first complementary bitline of the dual port memory cell during the WRITE assist pulse.

7. The method of claim 1 wherein the dual-port memory cell is a dual-port static random access memory (SRAM) cell.

8. An integrated circuit (IC) comprising:
    a first wordline;
    a second wordline;
    a first port bitline;
    a first port complementary bitline;
    a second port bitline;
    a second port complementary bitline;
    a memory cell having a first internal node connectable to the first port bitline through a first access transistor controlled by the first wordline and to the second port bitline through a second access transistor controlled by the second wordline, and a second internal node connectable to the first port complementary bitline through a third access transistor controlled by the first wordline and to the second port complementary bitline through a fourth access transistor controlled by the second wordline;
    a pull-up voltage supply;
    a WRITE-assist pulse generator circuit optimizing a WRITE assist signal based on an operating condition, and outputting the WRITE assist signal having a selected period; and
    a switch selectively coupling the pull-up voltage supply to the first port bitline and to the first port complementary bitline according to the WRITE assist signal for the selected period while the first port bitline is connected to the first internal node through the first access transistor and the first port complementary bitline is connected to the second internal node through the third access transistor.

9. The IC of claim 8 wherein the switch comprises a PMOS transistor connecting the pull-up power supply to each of the first port bitline and the first port complementary bitline.

10. The IC of claim 8 wherein the switch comprises a first PMOS transistor selectively connecting the pull-up power supply to the first port bitline and a second PMOS transistor selectively connecting the pull-up voltage supply to the first port complementary bitline and a balancing transistor connecting the first port bitline to the first port complementary bitline according to the WRITE assist signal.

11. The IC of claim 10 further comprising a first logic gate placing the first PMOS transistor, the second PMOS transistor, and the balancing transistor in a conductive state in response to the WRITE assist signal or a bitline pre-charge signal.

12. The IC of claim 9 further comprising a second logic gate producing the WRITE assist signal when each of a WRITE assist flag and a READ port pull-back signal are valid.

13. The IC of claim 8 further comprising a READ complete circuit producing a READ complete signal coupled to the WRITE assist pulse generator circuit.

14. The IC of claim 13 wherein the WRITE assist pulse generator circuit includes an offset portion adding a selected offset to the READ complete signal to produce a pulse start signal and a pulse width portion adding a selected duration to the pulse start signal.

15. The IC of claim 14 wherein the pulse width portion includes a multiplexer selecting a selected delay according to a multiplexer select signal to produce the selected duration.

16. The IC of claim 9 wherein the WRITE assist pulse generator circuit adds a selected offset to a READ complete signal and generates a selected duration to produce a READ port pull-back signal.

17. The IC of 16 wherein the memory cell is a static random access memory (SRAM) cell.

18. An integrated circuit (IC) comprising:
- a pull-up voltage supply;
- a memory cell having a first port and a second port;
- a first wordline coupled to the first port of the memory cell;
- a second wordline coupled to the second port of the memory cell;
- a first port bitline;
- a first port complementary bitline;
- a second port bitline;
- a second port complementary bitline;
- a WRITE-assist pulse generator optimizing a WRITE assist signal based on an operating condition, and outputting the WRITE assist signal having a period and a duration;
- a bitline pre-charge circuit; and
- a WRITE-assist circuit selectively connecting the pull-up voltage supply to the first port bitline and to the first port complementary bitline through the bitline pre-charge circuit according to the WRITE assist signal or a bitline pre-charge signal.

19. The IC of claim 18 wherein the pull-up voltage supply is Vdd.

20. The IC of claim 18 further comprising offset and width logic wherein the period is selectable by a user and the duration is selectable by the user according to a digital control signal.

* * * * *